(12) United States Patent
Song

(10) Patent No.: US 8,024,627 B2
(45) Date of Patent: Sep. 20, 2011

(54) SEMICONDUCTOR MEMORY DEVICE, OPERATING METHOD THEREOF, AND COMPRESSION TEST METHOD THEREOF

(75) Inventor: Seong-Hwi Song, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 605 days.

(21) Appl. No.: 12/165,094

(22) Filed: Jun. 30, 2008

(65) Prior Publication Data
US 2009/0273991 A1 Nov. 5, 2009

(30) Foreign Application Priority Data
Apr. 30, 2008 (KR) .................. 10-2008-0040830

(51) Int. Cl.
*G11C 29/00* (2006.01)
(52) U.S. Cl. ............... 714/718; 714/5; 714/25; 714/30; 714/42; 714/719; 714/720; 714/738; 365/200; 365/201
(58) Field of Classification Search .......................... None
See application file for complete search history.

(56) References Cited

U.S. PATENT DOCUMENTS

| 5,864,510 A | * | 1/1999 | Nakaoka | 365/201 |
| 6,163,863 A | * | 12/2000 | Schicht | 714/718 |
| 7,096,386 B2 | * | 8/2006 | Ozawa | 714/30 |
| 7,187,195 B2 | * | 3/2007 | Kim | 326/16 |
| 2004/0255211 A1 | * | 12/2004 | Cooper et al. | 714/726 |
| 2006/0156213 A1 | * | 7/2006 | Kikutake et al. | 714/800 |
| 2007/0070740 A1 | * | 3/2007 | Song | 365/201 |
| 2009/0040852 A1 | * | 2/2009 | Tomita | 365/201 |

FOREIGN PATENT DOCUMENTS

| KR | 1019910005306 B1 | 7/1991 |
| KR | 1020060104102 A | 10/2006 |
| KR | 1020070036638 A | 4/2007 |
| KR | 1020070068057 A * | 6/2007 |

OTHER PUBLICATIONS

Notice of Preliminary Rejection issued from Korean Intellectual Property Office on Aug. 13, 2009 with an English Translation.

* cited by examiner

*Primary Examiner* — John P Trimmings
(74) *Attorney, Agent, or Firm* — IP & T Group LLP

(57) ABSTRACT

A semiconductor memory device including a plurality of banks, each including a plurality of memory cells, a pattern signal generator configured to generate pattern signals having combinations in response to an input signal applied through an arbitrary pad in a compression test mode. Input paths are configured to transfer the plurality of pattern signals to the corresponding banks.

11 Claims, 11 Drawing Sheets

SEMICONDUCTOR MEMORY DEVICE, OPERATING METHOD THEREOF, AND COMPRESSION TEST METHOD THEREOF

CROSS-REFERENCE TO RELATED APPLICATION

The present invention claims priority of Korean patent application number 10-2008-0040830, filed on Apr. 30, 2008, which is incorporated by reference in its entirety.

BACKGROUND OF THE INVENTION

The present invention relates to a semiconductor design technology, and more particularly, to a semiconductor memory device having a compression test mode.

As the fabrication technologies of semiconductor memory devices such as double data rate (DDR) synchronous dynamic random access memory (SDRAM) are rapidly advanced, the integration density of the semiconductor memory devices increases. Thus, ten millions of memory cells are integrated into a single semiconductor memory device. Due to the increase in the number of the memory cells, much more data can be stored. However, it takes a lot of time to test the memory cells. That is, a lot of test time is taken to determine pass/fail of ten millions of memory cells. The test time is an important factor in determining the product cost. Many attempts have been made to reduce the test time. One of them is a compression test method. The compression test method is to compress data stored in a plurality of memory cells. A test operator can determine whether the corresponding memory cell is normal or defective, based on the compressed data.

Meanwhile, a semiconductor memory device is designed to operate according to a data width option. The data width option is defined in a specification as an option that enables a user to set a desired data width. For example, if the data width option is set to "x8" in a semiconductor memory device having eight input/output pads, the data input/output operation is performed through the eight input/output pads. If the data width option is set to "x4", the data input/output operation is performed through eight data input/output pads among the eight input/output pads.

The data width option may be set in a mode register set (MRS) provided in the semiconductor memory device. In addition to the data width option, a column address strobe (CAS) latency, a burst type, and a burst length may be set in the MRS. Information on additional operations may also be set in the MRS.

FIG. 1 is a block diagram of a conventional semiconductor memory device. A DDR2 SDRAM is exemplarily illustrated in FIG. 1. The DDR2 SDRAM includes eight banks of memory cells and eight input/output pads and can be set to x8 or x4 data width option. Also, since the DDR2 SDRAM uses a 4-bit prefetch scheme, each global input/output line includes four global input/output lines. That is, a first global input/output line GIO1 includes four global input/output lines GIO1<1>, GIO1<2>, GIO1<3> and GIO1<4>. For convenience, the four global input/output lines GIO1<1>, GIO1<2>, GIO1<3> and GIO1<4> are indicated by one global input/output line GIO1.

Referring to FIG. 1, the semiconductor memory device includes first to eighth banks. A row decoder/bank controller, a column decoder, and a write driver/read driver are provided in each bank. For convenience, a reference numeral "110B" is assigned to the row decoder/bank controller for the first bank 110A, and a reference numeral "110C" is assigned to the column decoder for the first bank 110A. Also, a reference numeral "110D" is assigned to the write driver/read driver for the first bank 110A.

The first to eighth banks are respectively selected by the bank controllers according to external bank addresses. Each of the first to eighth banks includes a plurality of memory cells. Specific memory cells of the selected banks are accessed by external row addresses and external column addresses. Therefore, data stored in the accessed memory cells are input/output through the first to eighth global input/output lines GIO1, GIO2, GIO3, GIO4, GIO5, GIO6, GIO7 and GIO8.

FIG. 2 is a circuit diagram illustrating a read operation and a write operation of a semiconductor memory device. In FIG. 2, a specific memory cell 210 among the plurality of memory cells included in the first bank 110A is illustrated as a representative.

The read operation of the semiconductor memory device will be described below with reference to FIGS. 1 and 2. Herein, description about a bank selection operation of the bank controller (see FIG. 1) will be omitted.

In the read operation, the row decoder (see FIG. 1) decodes a row address and enables a word line WL selected by the decoded row address. When the word lien WL is enabled, a cell transistor T1 of the memory cell 210 is turned on, and data stored in a cell capacitor C1 is charge-shared with precharged positive/negative bit lines BL and /BL. Due to the charge sharing operation, the positive/negative bit lines BL and /BL have a slight voltage difference. For reference, the precharge voltage has half the voltage level of an internal voltage, especially a core voltage.

A bit line sense amplifier 220 senses and amplifies the slight voltage difference between the positive bit line BL and the negative bit line /BL. When the voltage level of the positive bit line BL is higher than that of the negative bit line /BL, the voltage level of the positive bit line BL is amplified to a pull-up voltage level RTO, and the voltage level of the negative bit line /BL is amplified to a pull-down voltage level SB. On the other hand, when the voltage level of the positive bit line BL is lower than that of the negative bit line /BL, the voltage level of the positive bit line BL is amplified to a pull-down voltage level SB, and the voltage level of the negative bit line /BL is amplified to a pull-up voltage level RTO.

Meanwhile, the column decoder 110C decodes the column address and activates a corresponding column select signal YI. In response to the column select signal YI, the column selector 230 is enabled to connect the positive/negative bit lines BL and /BL to positive/negative segment input/output lines SIO and /SIO, respectively. That is, the amplified data on the positive bit line BL is transferred to the positive segment input/output line SIO, and the amplified data on the negative bit line /BL is transferred to the negative segment input/output line /SIO. Thereafter, when the input/output switching unit 240 is enabled in response to an input/output control signal CRT_IO, the positive/negative segment input/output lines SIO and /SIO are connected to positive/negative local input/output lines LIO and /LIO, respectively. That is, the data on the positive segment input/output line SIO is transferred to the positive local input/output line LIO, and the data on the negative segment input/output line /SIO is transferred to the negative local input/output line /LIO. The read driver 250 drives the first global input/output lien GIO1 according to the data transferred to the positive/negative local input/output lines LIO and /LIO.

Consequently, the data stored in the memory cell 210 are transferred to the first global input/output line GIO1 through the positive/negative bit lines BL and /BL, the positive/negative segment input/output lines SIO and /SIO, and the positive/negative local input/output lines LIO and /LIO.

Meanwhile, the external data input in a write operation is transferred in a direction opposite to the read operation. That is, the data is transferred from the first global input/output line GIO1 through the write driver 260 to the positive/negative local input/output lines LIO and /LIO, and then transferred through the positive/negative segment input/output lines SIO and /SIO to the positive/negative bit lines BL and /BL. The transferred data is finally stored in the memory cell 210.

For reference, RC loading caused by a plurality of resistors R and capacitors C illustrated in FIG. 2 is reflected on the data transferred through the respective lines.

The other blocks of the conventional semiconductor memory device will be described with reference to FIG. 1. First, the block associated with the read operation of the semiconductor memory device in the normal mode will be described. The description of the compression operation, that is, the first to fourth global compressors 170_1, 170_2, 170_3 and 170_4 and the compression test signal TPARA, will be described later with reference to FIG. 3.

The first to eighth global input/output lines GIO1, GIO2, GIO3, GIO4, GIO5, GIO6, GIO7 and GIO8 are input to the first to eighth output selectors 120_1, 120_2, 120_3, 120_4, 1205, 1206, 120_7 and 120_8. The first to eighth output selectors 120_1, 120_2, 120_3, 120_4, 120_5, 120_6, 120_7 and 120_8 output signals transferred through the first to eighth global input/output lines GIO1, GIO2, GIO3, GIO4, GIO5, GIO6, GIO7 and GIO8 in response to the selection signals IOx4 and CADD<11>.

The first to eighth global input/output lines GIO1, GIO2, GIO3, GIO4, GIO5, GIO6, GIO7 and GIO8 are connected to the first to eighth output selectors 1201, 1202, 1203, 1204, 1205, 1206, 120_7 and 120_8, respectively. In particular, the fifth to eighth global input/output lines GIO5, GIO6, GIO7 and GIO8 are further connected to the first to fourth output selectors 120_1, 120_2, 120_3 and 120_4 in order to execute the data width option. The selection signals include the data width option signal IOx4 and the line selection signal CADD<11>. The data width option signal IOx4 is a signal corresponding to the x4 data width option and the x8 data width option, and the line selection signal CADD<11> is a signal for selecting a desired one of the connected global input/output lines.

The first to fourth output selectors 120_1, 120_2, 120_3 and 120_4 or the fifth to eighth output selectors 120_5, 120_6, 120_7 and 120_8 are enabled in response to the data width option signal IOx4. When the first to fourth output selectors 120_1, 120_2, 120_3 and 120_4 are enabled, they output signals transferred through the global input/output lines selected in response to the line selection signal CADD<11>.

Meanwhile, first to eighth pipe latches 130_1, 130_2, 130_3, 130_4, 130_4, 130_5, 130_6, 130_7 and 130_8 latch output signals of the first to eighth output selectors 120_1, 120_2, 120_3, 120_4, 120_5, 120_6, 120_7 and 120_8, respectively. The output signals of the first to eighth output selectors 120_1, 120_2, 120_3, 120_4, 120_5, 120_6, 120_7 and 120_8 are output in parallel, and the first to eighth pipe latches 130_1, 130_2, 130_3, 130_4, 130_5, 130_6, 130_7 and 130_8 convert them into serial form.

The output signals of the first to eighth pipe latches 130_1, 130_2, 130_3, 130_4, 130_4, 130_5, 130_5, 130_6, 130_7 and 130_8 are output to the outside through the first to eighth input/output pads 140_1, 140_2, 140_3, 140_4, 1405, 1406, 140_7 and 140_8.

In other words, in the x8 data width option, the data corresponding to the first to eighth banks are input to the first to eighth output selectors 120_1, 120_2, 120_3, 120_4, 120_5, 120_6, 120_7 and 120_8 through the first to eighth global input/output lines GIO1, GIO2, GIO3, GIO4, GIO5, GIO6, GIO7 and GIO8. The output signals of the first to eighth output selectors 120_1, 120_2, 120_3, 120_4, 120_5, 120_6, 120_7 and 120_8 are latched in the first to eighth pipe latches 130_1, 130_2, 130_3, 130_4, 130_5, 130_6, 130_7 and 130_8 and output to the first to eighth input/output pads 140_1, 140_2, 140_3, 140_4, 140_5, 140_6, 140_7 and 140_8.

In the x4 data width option, the data corresponding to the first to fourth banks or the data stored in the fifth to eighth banks are input to the first to fourth output selectors 120_1, 120_2, 120_3 and 120_4 through the first to fourth global input/output lines GIO1, GIO2, GIO3 and GIO4 or the fifth to eighth global input/output lines GIO5, GIO6, GIO7 and GIO8. At this point, the first to fourth output selectors 120_1, 120_2, 120_3 and 120_4 are selected by the data width option signal IOx4. The first to fourth output selectors 120_1, 120_2, 120_3 and 120_4 output the signals transferred through the first to fourth global input/output lines GIO1, GIO2, GIO3 and GIO4 or the fifth to eighth global input/output lines GIO5, GIO6, GIO7 and GIO8 in response to the data width option signal IOx4 and the line selection signal CADD<11>. The transferred signals are latched in the first to fourth pipe latches 130_1, 130_2, 130_3 and 130_4 and output to the first to fourth input/output pads 140_1, 140_2, 140_3 and 140_4.

The blocks associated with the write operation of the semiconductor memory device in the normal mode will be described below.

The first to eighth input/output pads 140_1, 140_2, 140_3, 140_4, 140_5, 140_6, 140_7 and 140_8 receive serial data from the outside. First to eighth data aligners 150_1, 150_2, 150_3, 150_4, 150_5, 150_6, 150_7 and 150_8 align the serial data input through the first to eighth input/output pads 140_1, 140_2, 140_3, 140_4, 140_5, 140_6, 140_7 and 140_8 in parallel form.

First to eighth input selectors 160_1, 160_2, 160_3, 160_4, 160_5, 160_6, 160_7 and 160_8 output the output signals of the first to eighth data aligners 150_1, 150_2, 150_3, 150_4, 150_5, 150_6, 150_7 and 150_8 to the first to eighth global input/output lines GIO1, GIO2, GIO3, GIO4, GIO5, GIO6, GIO7 and GIO8 in response to the data width option signal IOx4 and the line selection signal CADD<11>. The data applied to the first to eighth global input/output lines GIO1, GIO2, GIO3, GIO4, GIO5, GIO6, GIO7 and GIO8 are stored in the first to eighth banks, respectively.

The write operation must also be performed according to the data width option. The first to fourth input selectors 160_1, 160_2, 160_3 and 160_4 or the fifth to eighth input selectors 1605, 1606, 160_7 and 160_8 are enabled in response to the data width option signal IOx4. When the first to fourth input selectors 160_1, 160_2, 160_3 and 160_4 are enabled, they output the output signals of the first to fourth data aligners 150_1, 150_2, 150_3 and 150_4 to the global input/output lines selected in response to the line selection signal CADD<11>.

In other words, in the case of the x8 data width option, the data input through the first to eighth input/output pads 140_1, 140_2, 140_3, 140_4, 140_5, 140_6, 140_7 and 140_8 are output as aligned data by the first to eighth data aligners 150_1, 150_2, 150_3, 150_4, 150_5, 150_6, 150_7 and 150_8. The aligned data are input to the first to eighth input selectors 160_1, 160_2, 160_3, 160_4, 160_5, 160_6, 160_7 and 160_8 and output through the first to eighth global input/output lines GIO1, GIO2, GIO3, GIO4, GIO5, GIO6, GIO7 and GIO8. Finally, the first to eighth banks store data input through the first to eighth global input/output lines GIO1, GIO2, GIO3, GIO4, GIO5, GIO6, GIO7 and GIO8.

In the case of the x4 data width option, the data input through the first to fourth input/output pads 140_1, 140_2, 140_3 and 140_4 are output as the aligned data by the first to fourth data aligners 150_1, 150_2, 150_3 and 150_4. At this point, the first to fourth input selectors 160_1 160_2, 160_3 and 160_4 are selected by the data width option signal IOx4, while the fifth to eighth input selectors 160_5, 160_6, 160_7 AND 160_8 are not selected. Therefore, the first to fourth input selectors 160_1, 160_2, 160_3 AND 160_4 output the aligned data through the first to fourth global input/output lines GIO1, GIO2, GIO3 and GIO4 or the fifth to eighth global input/output lines GIO5, GIO6, GIO7 and GIO8 in response to the data width option signal IOx4 and the line selection signal CADD<11>. The first to fourth banks or the fifth to eighth banks store the data transferred through the corresponding global input/output lines.

FIG. 3 is a block diagram for explaining the blocks associated with a compression operation of the semiconductor memory device. For convenience, new reference numerals are assigned to respective elements. A data compression unit 380 is further illustrated in a region where a column decoder 310C and a write driver/read driver 310D are disposed. For reference, since data are compressed in a compression test mode, only the first to fourth input/output pads 340_1, 340_2, 340_3 and 340_4 are needed.

First, the blocks associated with the data read operation in the compression test mode will be described below.

Data compressors 380 are provided in the first to eighth banks. The data compressors 380 compress data applied to sub global input/output lines IGIO<1:8> of the banks and output the compressed data through the global input/output lines. For convenience, the first bank 110A will be described as a representative example. The sub global input/output lines IGIO<1:8> transfer data stored in the eight memory cells corresponding to the first bank 110A. Since the first global input/output line GIO1 includes four global input/output lines GIO1<1:4>, 32 data are compressed and applied to the four global input/output lines GIO1<1:4>.

Meanwhile, first to fourth global compressors 370_1, 370_2, 370_3 and 370_4 compress data input through the global input/output lines connected thereto to generate first to fourth global compression data GIOSUM15, GIOSUM26, GIOSUM37 and GIOSUM48.

In other words, the first global compressor 370_1 compresses the data input through the first global input/output line GIO1 and the fifth global input/output line GIO5 to generate the first global compression data GIOSUM15. The second global compressor 370_2 compresses the data input through the second global input/output line GIO2 and the sixth global input/output line GIO6 to generate the second global compression data GIOSUM26. The third global compressor 370_3 compresses the data input through the third global input/output line GIO3 and the seventh global input/output line GIO7 to generate the third global compression data GIOSUM37. The fourth global compressor 370_4 compresses the data input through the fourth global input/output line GIO4 and the eighth global input/output line GIO8 to generate the fourth global compression data GIOSUM48.

The first to fourth global compression data GIOSUM15, GIOSUM 26, GIOSUM37 and GIOSUM48 are input to the first to fourth output selectors 320_1, 320_2, 320_3 and 320_4, respectively. The first to fourth output selectors 320_1, 320_2, 320_3 and 320_4 output the first to fourth global compression data GIOSUM15, GIOSUM26, GIOSUM37 and GIOSUM48 to the first to fourth pipe latches 330_1, 330_2, 330_3 and 340_4 in response to the compression test signal TPARA. The first to fourth pipe latches 330_1, 330_2, 330_3 and 330_4 latch and output the first to fourth global compression data GIOSUM15, GIOSUM26, GIOSUM37 and GIOSUM48 to the first to fourth input/output pads 340_1, 340_2, 340_3 and 340_4. The first to fourth global compression data GIOSUM15, GIOSUM26, GIOSUM37 and GIOSUM48 are output to the outside through the first to fourth input/output pads 340_1, 340_2, 340_3 and 340_4. The compression test signal TPARA is a signal that is activated in a compression test mode for a compression test.

The blocks associated with the data write operation in the compression test mode will be described below.

The data input through the first to fourth input/output pads 340_1, 340_2, 340_3 and 340_4 are aligned by the first to fourth data aligners 350_1, 350_2, 350_3 and 350_4 and input to the first to fourth input selectors 360_1, 360_2, 360_3 and 360_4. The first to fourth input selectors 360_1, 360_2, 360_3 and 360_4 output the data to the global input/output lines in response to the compression test signal TPARA. That is, the first input selector 360_1 outputs the data to the first and fifth global input/output lines GIO1 and GIO5; the second input selector 360_2 outputs the data to the second and sixth global input/output lines GIO2 and GIO6; the third input selector 360_3 outputs the data to the third and seventh global input/output lines GIO3 and GIO7; and the fourth input selector 360_4 outputs the data to the fourth and eighth global input/output lines GIO4 and GIO8. Thereafter, the data transferred through the first to eighth global input/output lines GIO1, GIO2, GIO3, GIO4, GIO5, GIO6, GIO7 and GIO8 are stored in the first to eighth banks, respectively.

As described above, in the compression test mode, the conventional semiconductor memory device stores the data in the banks by using the four input/output pads, and outputs the compressed data by using the four input/output pads. When storing the data in the banks by using the four input/output pads, the test operator must apply the data to be stored in the banks to the respective input/output pads. In addition, since a test apparatus having finite test pins must allocate four test pins per the semiconductor memory device, there is a limitation in the number of semiconductor memory devices that can be tested at a time.

SUMMARY OF THE INVENTION

Embodiments of the present invention are directed to providing a semiconductor memory device that can execute a compression test mode using a minimum number of input/output pads.

Embodiments of the invention are also directed to providing a semiconductor memory device that need not input every data to be stored in the respective banks through the respective pads in a compression test mode.

In accordance with an aspect of the invention, there is provided a semiconductor memory device, comprising a plurality of banks including a plurality of memory cells, a pattern signal generator configured to generate a plurality of pattern signals having a plurality of combinations in response to an input signal applied through an arbitrary pad in a compression test mode, and a plurality of input paths configured to transfer the plurality of pattern signals to the corresponding banks.

In accordance with an aspect of the invention, there is provided a semiconductor memory device, comprising, a plurality of banks including a plurality of memory cells, a pattern signal generator configured to generate a plurality of pattern signals having a plurality of combinations in response to an input signal applied through an arbitrary pad in a compression test mode, a plurality of input paths through which the plurality of pattern signals are transferred to the corresponding banks, and an output path configured to compress the data stored in the banks and output the compressed data through an arbitrary pad in the compression test mode.

In accordance with further aspect of the invention, there is provided a compression test method of a semiconductor memory device, the compression test method comprising generating a plurality of pattern signals having a plurality of combinations in response to an input signal applied through an arbitrary pad in a compression test mode, storing data corresponding to the pattern signals in a plurality of banks, and compressing the data stored in the banks to output the compressed data through an arbitrary pad.

In accordance with still further aspect of the invention, there is provided a method for operating a semiconductor memory device, the method comprising inputting/outputting data through a plurality of pads in a normal mode, generating a plurality of pattern signals having a plurality of combinations in response to an input signal applied through one arbitrary pad of the plurality of pads in a compression test mode, storing data corresponding to the pattern signals in a plurality of banks, compressing the data stored in the banks to output the compressed data through one arbitrary pad of the plurality of pads, As the fabrication technologies of semiconductor memory devices are rapidly advanced, the integration density of the semiconductor memory devices increases so that ten millions of memory cells are integrated into a single semiconductor memory device. A compression test mode was proposed in order to test tens millions of memory cells in a short time. However, when storing the data in the banks in the compression test mode, the test operator must apply data to the respective input/output pads. In outputting the compressed data to the plurality of input/output pads, there is a limitation in the number of semiconductor memory devices that can be tested at a time according to the test pins of the test apparatus. In accordance with the invention, a minimum number of input/output pads can be used in the compression test mode. Therefore, the work efficiency is maximized because the data can be stored in the banks through a minimum number of input/output pads. Furthermore, data of various patterns can be stored in the banks even though a minimum number of input/output pads are used. Moreover, the number of the semiconductor memory devices that can be tested at a time is maximized because the compressed data can be output through a minimum number of input/output pads.

DESCRIPTION OF SPECIFIC EMBODIMENTS

Hereinafter, a semiconductor memory device, an operating method thereof, and a compression test method thereof in accordance with the present invention will be described in detail with reference to the accompanying drawings.

Figure 4:
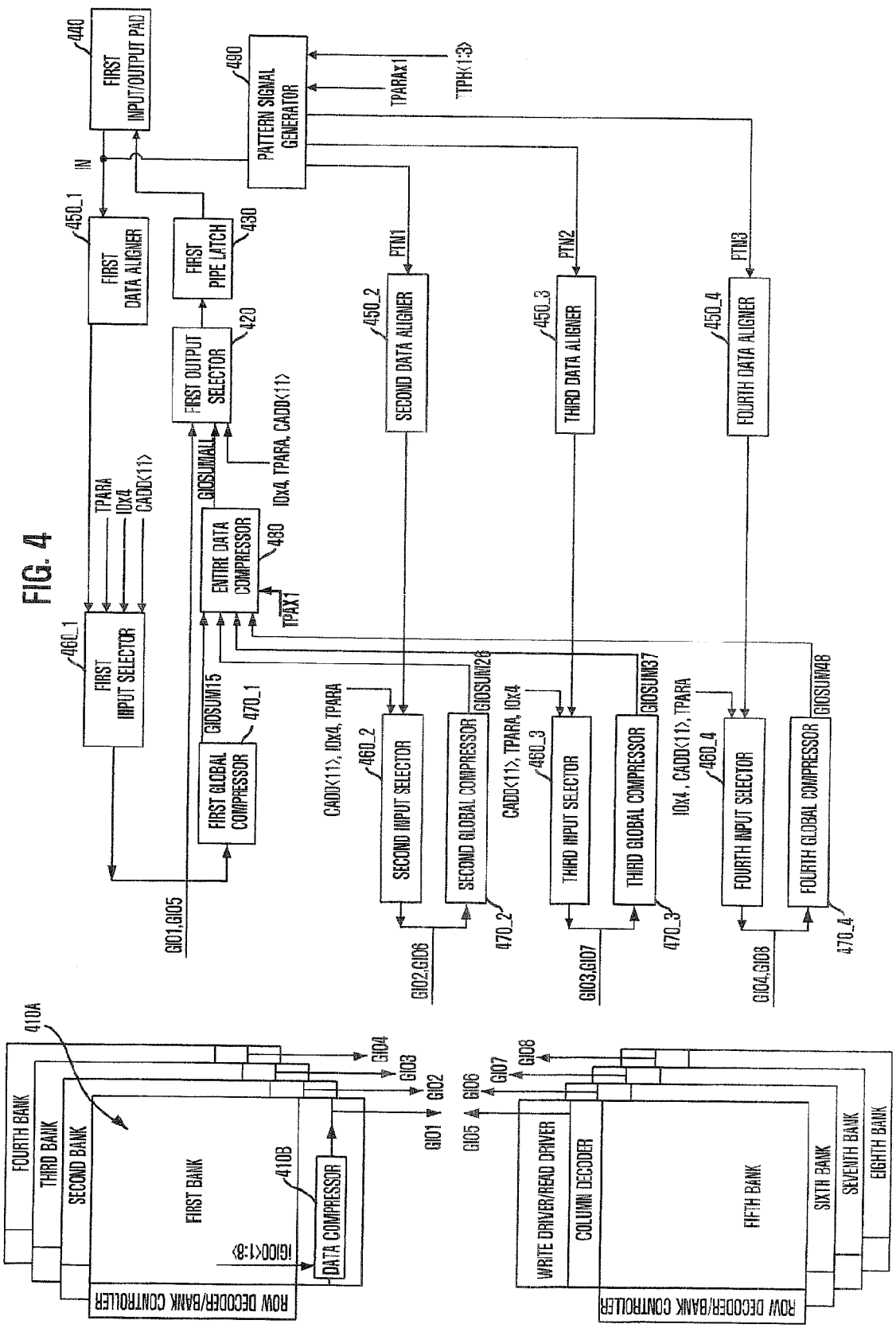
FIG. 4 is a block diagram of a semiconductor memory device in accordance with an embodiment of the present invention.

FIG. 4 is a block diagram of a semiconductor memory device in accordance with an embodiment of the invention. A DDR2 SDRAM is exemplarily illustrated in FIG. 4. The DDR2 SDRAM includes eight banks and eight input/output pads and can be set to x8 or x4 data width option. Also, since the DDR2 SDRAM uses a 4-bit prefetch scheme, each global input/output line includes four global input/output lines. That is, a first global input/output line GIO1 includes four global input/output lines GIO1<1>, GIO1<2>, GIO1<3> and GIO1<4>. For convenience, the four global input/output lines GIO1<1>, GIO1<2>, GIO1<3> and GIO1<4> are indicated by one global input/output line GIO1. The number of the banks, the number of the input/output pads, and the number of the global input/output lines may be changed according to design.

The semiconductor memory device in accordance with the embodiment of the invention can input/output data through a plurality of input/output pads in a normal mode, can receive data through arbitrary input/output pads and store data having various patterns in all banks in a compression test mode, and can compress the data stored in the banks to output the compressed data through the arbitrary pads. For convenience, only the first input/output pad 440 among the eight input/output pads is illustrated in FIG. 4. Hereinafter, the read and write operations in the normal mode and the read and write operations in the compression test mode with respect to the first input/output pad 440 will be described below.

Referring to FIG. 4, the semiconductor memory device includes first to eighth banks, row decoders/bank controllers, column decoders, write drivers/read drivers, and data compressors. For convenience, a reference numeral "410B" is assigned to a data compressor corresponding to the first bank 410A.

The first to eighth banks may be selected by the bank controllers according to external bank addresses. Each of the first to eighth banks includes a plurality of memory cells, and specific memory cells of the selected bank may be accessed by external row addresses and column addresses. Therefore, the data may be input and output through the first to eighth global input/output lines GIO1, GIO2, GIO3, GIO4, GIO5, GIO6, GIO7 and GIO8 corresponding to the accessed memory cells.

The row decoder decodes row addresses to selectively enable corresponding word lines (not shown), and the column decoder decodes column addresses to selectively activate corresponding column selection signals (not shown). The read drivers transfer data stored in the banks to the global input/output lines, and the write drivers transfer data applied to the global input/output lines to the banks.

The other blocks of the semiconductor memory device in accordance with the embodiment of the invention will be described below. First, the block associated with the read operation of the semiconductor memory device in the normal mode will be described. For convenience, the block associated with the first and fifth global input/output lines GIO1, GIO2, GIO3, GIO4 and GIO5 will be described as a representative example. That is, the description about the first to eighth output selectors 120_2, 120_3, 120_4, 120_5, 120_6, 120_7 and 120_8, the second to eighth pipe latches 130_2, 130_3, 130_4, 130_5, 130_6, 130_7 and 130_8, and the second to eighth input/output pads 140_2, 1403, 140_4, 1405, 1406, 140_7 and 140_8 will be omitted.

The first and fifth global input/output lines GIO1 and GIO5 are connected to the first output selector 420 in order to execute the data width option. The first output selector 420 outputs data transferred through the first global input/output line GIO1 or the fifth global input/output line GIO5 in response to the selection signals IOx4 and CADD<11>. The selection signals include the data width option signal IOx4 and the line selection signal CADD<11>. The data width option signal IOx4 is a signal corresponding to the x4 data width option and the x8 data width option, and the line selection signal CADD<11> is a signal for selecting the first global input/output line GIO1 or the fifth global input/output line GIO5.

The first output selector 420 can selectively output the signals transferred through the first global input/output line GIO1 or the fifth global input/output line GIO5 in response to the data width option signal IOx4 and the line selection signal CADD<11>.

The first pipe latch 430 latches output signals of the first output selector 420. The output signals of the first output selector 420 are output in parallel, and the first pipe latch 430 converts them in serial form. The first input/output pad 440 receives and outputs the output signals of the first pipe latch 430.

In the case of the x8 data width option, data stored in the first and fifth banks are input to the corresponding output selectors through the first and fifth global input/output global input/output lines GIO1 and GIO5. The output signals of the output selectors are latched in the corresponding pipe latches and output to the corresponding input/output pads.

In the case of the x4 data width option, the data stored in the first and fifth banks are input to the first output selector 420 through the first and fifth global input/output lines GIO1 and GIO5. The first output selector 420 can output the signals transferred through the first global input/output line GIO1 or the fifth global input/output line GIO5 in response to the data width option signal IOx4 and the line selection signal CADD<11>. The output signals are latched in the first pipe latch 430 and output to the first input/output pad 440.

The block associated with the read operation of the semiconductor memory device in the normal mode will be described below.

The first input/output pad 440 receives external data input in serial form. The first data aligner 450_1 aligns the serial data input through the first input/output pad 440 in parallel form. The first input selector 460_1 selectively applies the output signal of the first data aligner 450_1 to the first or fifth global input/output line GIO1 or GIO5 in response to the data width option signal IOx4 and the line selection signal CADD<11>.

Meanwhile, in the case of the x8 data width option, the data input through the first input/output pad 440 are output as the aligned data by the first data aligner 450_1. The aligned data are input to the first input selector 460_1 and output through the first global input/output line GIO1. Consequently, the first bank 410A stores signals transferred through the first global input/output line GIO1.

In the case of the x4 data width option, the data input through the first input/output pad 440 are output as the aligned data by the first data aligner 450_1. The first input selector 460_1 outputs the aligned data through the first input selector 460_1 or the fifth global input/output line GIO5 in response to the data width option signal IOx4 and the line selection signal CADD<11>. Consequently, the first bank 410A or the fifth bank store signals transferred through the first global input/output line GIO1 or the fifth global input/output line GIO5.

The block associated with the read operation of the semiconductor memory device in the compression test mode will be described below.

The data compressor 410B is provided in each of the first to eighth banks. The data compressor 410B compresses data of sub global input/output lines IGIO<1:8> of the banks and output the compressed data through the corresponding global input/output lines. For convenience, the first bank 410A will be described as a representative example. The sub global input/output lines IGIO<1:8> transfer data stored in the eight memory cells of the first bank 410A. Since the first global input/output line GIO1 includes four global input/output lines GIO1<1:4>, 32 data are compressed and applied to the four global input/output lines GIO1<1:4>.

Figure 5:
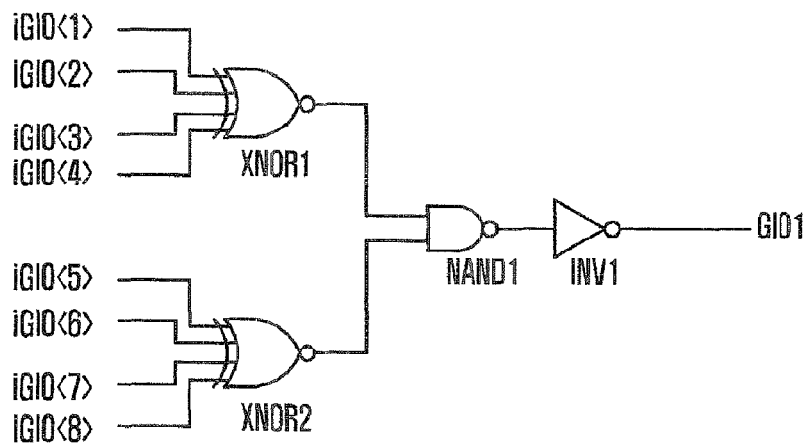
FIG. 5 is a circuit diagram of a data compressor 410B of FIG. 4.

FIG. 5 is a circuit diagram of the data compressor 410B of FIG. 4.

Referring to FIG. 5, the data compressor 410B includes first and second exclusive NOR gates XNOR1 and XNOR2 configured to receive data transferred through the sub global input/output lines IGIO<1:8>, a first NAND gate NAND1 configured to receive output signals of the first and second exclusive NOR gates XNOR1 and XNOR2, and a first inverter INV1 configured to invert an output signal of the first NAND gate NAND1 to output the inverted signal to the first global input/output line GIO1.

The first exclusive NOR gate XNOR1 outputs a logic high signal when the four sub global input/output lines IGIO<1:4> have the same logic level, and outputs a logic low signal when the four sub global input/output lines IGIO<1:4> do not have the same logic level. The second exclusive NOR gate XNOR2 outputs a logic high signal when the four sub global input/output lines IGIO<5:8> have the same logic level, and outputs a logic low signal when the four sub global input/output lines IGIO<5:8> do not have the same logic level. Due to the first NAND gate NAND1 and the first inverter INV1, the first global input/output line GIO1 is driven to a logic high level when all the output signals of the first and second exclusive NOR gates XNOR1 and XNOR2 have a logic high level. On the other hand, when all the output signals of the first and second exclusive NOR gates XNOR1 and XNOR2 does not have a logic high level, the first global input/output line G1OO is driven to a logic low level.

Although described later, since the same data are stored in one bank in the compression test mode, the same data will be applied to the eight sub global input/output lines IGIO<1:8> if the memory cells corresponding to the eight sub global input/output lines IGIO<1:8> are all normal. That is, a logic high level may be applied to the first global input/output line GIO1 if the memory cells corresponding to the eight sub global input/output lines IGIO<1:8> are all normal. However, a logic low level may be applied to the first global input/output line GIO1 if any one of the memory cells is defective.

Referring again to FIG. 4, the first to fourth global compressors 470_1, 470_2, 470_3 and 470_4 compress signals input through the corresponding global input/output lines and generate first to fourth global compression data GIOSUM15, GIOSUM26, GIOSUM37 and GIOSUM48. In other words, the first global compressor 470_1 compresses data input through the first global input/output line GIO1 and the fifth global input/output line GIO5 to generate the first global compression data GIOSUM15, and the second global compressor 470_2 compresses data input through the second global input/output line GIO2 and the sixth global input/output line GIO6 to generate the second global compression data GIOSUM26. The third global compressor 470_3 compresses data input through the third global input/output line GIO3 and the seventh global input/output line GIO7 to generate the third global compression data GIOSUM37, and the fourth global compressor 470_4 compresses data input through the fourth global input/output line GIO4 and the eighth global input/output line GIO8 to generate the fourth global compression data GIOSUM48.

Figure 6:
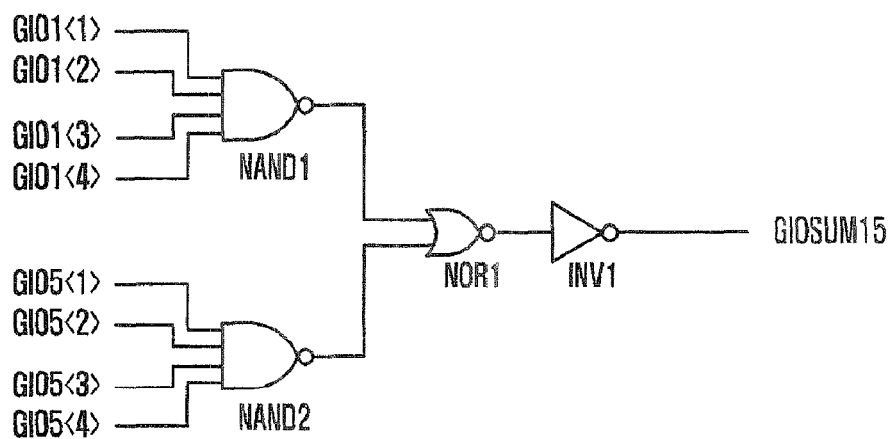
FIG. 6 is a circuit diagram of a first global compressor 470_1 of FIG. 4.

FIG. 6 is a circuit diagram of the first global compressor 470_1 of FIG. 4. Since the second to fourth global compressors 470_2, 470_3 and 470_4 have the similar structure to the first global compressor 470_1, their detailed description will be omitted. As described above, the first global input/output line GIO1 includes four global input/output lines GIO1<1>, GIO1<2>, GIO1<3> and GIO1<4>. In addition, each of the second to eighth global input/output lines GIO2, GIO3, GIO4, GIO5, GIO6, GIO7 and GIO8 includes four global input/output lines.

Referring to FIG. 6, the first global compressor 470_1 includes a first NAND gate NAND1 configured to receive data transferred through the global input/output lines GIO1<1:4> of the first global input/output line GIO1, a second NAND gate NAND2 configured to receive data transferred through the global input/output lines GIO5<1:4> of the fifth global input/output line GIO5, a first NOR gate NOR1 configured to receive output signals of the first and second NAND gates NAND1 and NAND2, and a first inverter INV1 configured to invert an output signal of the first NOR gate NOR1 to output the first global compression data GIOSM15.

The first and second NAND gates NAND1 and NAND2 output a logic low level when the data transferred through the global input/output lines GIO1<1:4> and the data transferred through the global input/output lines GIO5<2:4> are all logic high. Due to the first NOR gate NOR1 and the first inverter INV1, the first global compression data GIOSUM15 becomes a logic low level when the output signals of the first and second NAND gates NAND1 and NAND2 are all logic low. On the other hand, the first global compression data GIOSUM15 becomes a logic high level when any one of the data transferred through the global input/output lines GIO1<1:4> and the data transferred through the global input/output lines GIO5<1:4> is a logic low level.

At this point, that the data transferred through the global input/output lines GIO1<1:4> and the data transferred through the global input/output lines GIO5<1:4> are logic high means that the corresponding memory cells are all normal, and that one or more of the data transferred through the global input/output lines GIO1<1:4> and GIO5<1:4> are logic low means that there exists a defect memory cell.

Referring again to FIG. 4, the entire data compressor 480 compresses the data of the first to fourth compression data GIOSUM15, GIOSUM26, GIOSUM37 and GIOSUM48 in response to the entire compression test signal TPARAx1 and outputs the entire compression data GIOSUMALL. At this point, the entire compression test signal TPARAx1 is activated through input/output pads in the data compression operation. The entire data compressor 480 outputs the first global compression data GIOSUM15 into the entire compression data GIOSUMALL in response to the entire compression test signal TPARAx1, or compresses the first to fourth global compression data GIOSUM15, GIOSUM26, GIOSUM37 and GIOSUM48 to output the entire compression data GIOSUMALL.

The semiconductor memory device in accordance with the embodiment of the invention can execute the compression test mode in the same manner as the related art, and can execute the compression test mode that can output one entire compression data. This is done for executing the existing compress data mode when the first global compression data GIOSUM15 is output as the entire compression data GIOSUMALL. That is, the second to fourth global compression data GIOSUM26, GIOSUM37 and GIOSUM48 are input to the second to fourth output selectors (not shown) and transferred to the second to fourth pipe latches (not shown) in response to the entire compression test signal TPARAx1.

Figure 7:
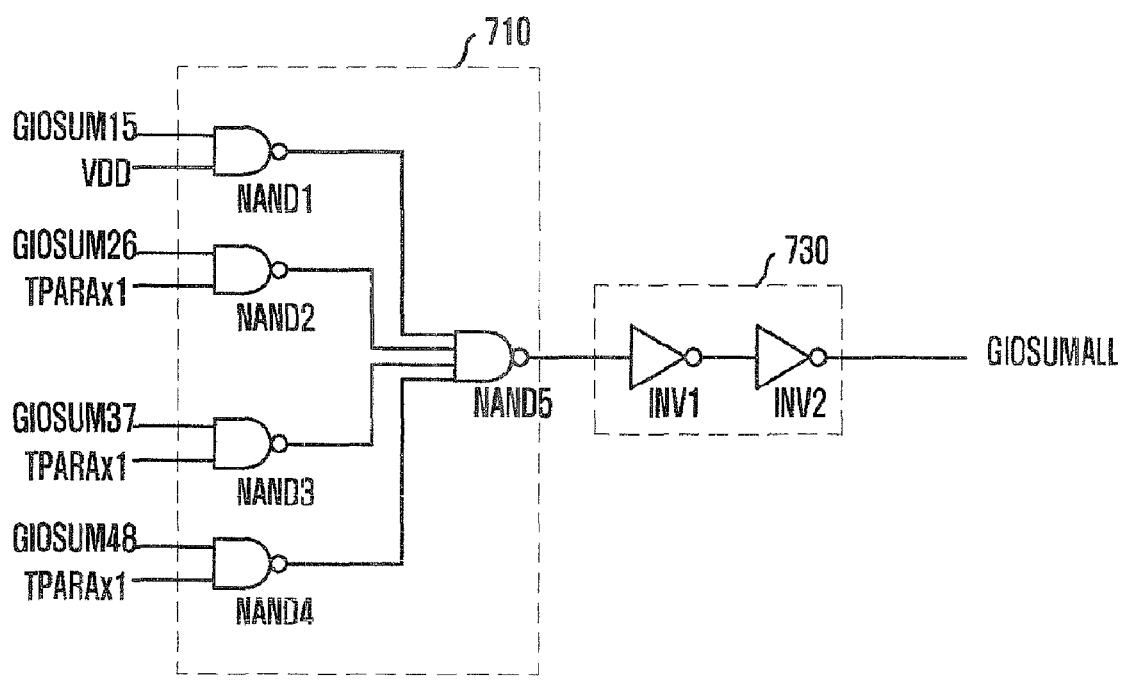
FIG. 7 is a circuit diagram of an entire data compressor 480 of FIG. 4.

FIG. 7 is a circuit diagram of the entire data compressor 480 of FIG. 4.

Referring to FIG. 7, the entire data compressor 480 includes an entire compression selecting unit 710 and a compression data output unit 730.

The entire compression selecting unit 710 selectively outputs the first global compression data GIOSUM15 or the compression data of the first to fourth global compression data GIOSUM15, GIOSUM26, GIOSUM37 and GIOSUM48 in response to the entire compression test signal TPARAx1. The entire compression selecting unit 710 includes a first NAND gate NAND1 configured to receive the first global compression data GIOSUM15 and the external power supply voltage VDD of logic high, a second NAND gate NAND2 configured to receive the second global compression data GIOSUM26 and the entire compression test signal TPARAx1, a third NAND gate NAND3 configured to receive the third global compression data GIOSUM37 and the entire compression test signal TPARAx1, a fourth NAND gate NAND4 configured to receive the fourth global compression data GIOSUM48 and the entire compression test signal TPARAx1, and a fifth NAND gate NAND5 configured to receive output signals of the first to fourth NAND gates NAND1, NAND2, NAND3 and NAND4.

The compression data output unit 730 receives the output signal of the entire compression selecting unit 710 to output the entire compression data GIOSUMALL. The compression data output unit 730 includes a first inverter INV1 configured to receive the output signal of the entire compression selecting unit 710, and a second inverter INV2 configured to invert an output signal of the first inverter INV1 to output the entire compression data GIOSUMALL.

The operation of the entire data compressor 480 will be described below.

When the entire compression test signal TPARAx1 is logic low, the entire compression data GIOSUMALL corresponding to the first global compression data GIOSUM15 is output, regardless of the second to fourth global compression data GIOSUM26, GIOSUM37 and GIOSUM48. In other words, when the first global compression data GIOSUM1 is logic low, that is, all memory cells are normal, the entire compression data GIOSUMALL becomes logic low. When the first global compression data GIOSUM15 is logic high, that is, there exist defective memory cells, the entire compression data GIOSUMALL becomes logic high.

When the entire compression test signal TPARAx1 is logic high, the first to fourth global compression data GIOSUM15, GIOSUM26, GIOSUM37 and GIOSUM48 are compressed to output the entire compression data GIOSUMALL. In other words, when the first to fourth global compression data GIO- SUM15, GIOSUM26, GIOSUM37 and GIOSUM48 are logic low, that is, all memory cells are normal, the entire compression data becomes logic low. When any one of the first to fourth global compression data GIOSUM15, GIOSUM26, GIOSUM37 and GIOSUM48 is logic high, that is, there exist defective memory cells, the entire compression data GIOSUMALL becomes logic high.

The entire compression data GIOSUMALL is one signal that is generated by compressing the data transferred through the first to eighth global input/output lines GIO1, GIO2, GIO3, GIO4, GIO5, GIO6, GIO7 and GIO8, and it can be output through the first input/output pad (440 in FIG. 4). That is, it is possible to output the signal corresponding to the entire compression data GIOSUMALL using one input/output pad in the compression test mode.

Referring again to FIG. 4, the first output selector 420 can selectively output the entire compression data GIOSUMALL or the signal input through the global input/output line GIO1 or GIO5 in response to the compression test signal TPARA. That is, the first output selector 420 selects the first global input/output line GIO1 or the fifth global input/output line GIO5 in response to the line selection signal CADD<11> and the data width option signal IOx4, or outputs the entire compression data GIOSUMALL in response to the compression test signal TPARA. The compression test signal TPARA is a signal that is activated in the compression test mode.

Figure 8:
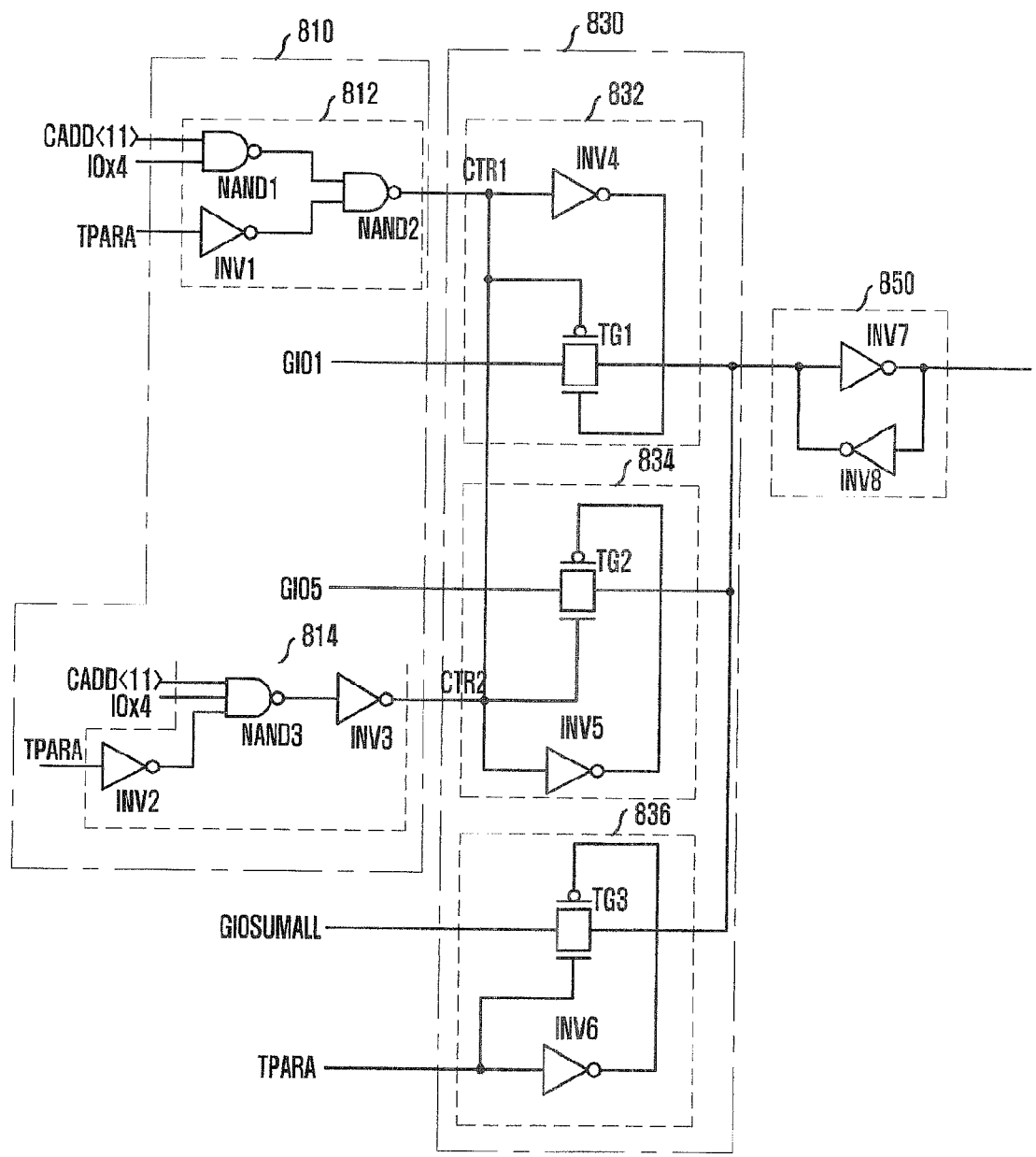
FIG. 8 is a circuit diagram of a first output selector 420 of FIG. 4.

FIG. 8 is a circuit diagram of the first output selector 420 of FIG. 4. The second to fourth output selectors (not shown) have a structure similar to the first output selector 420 and respectively receive the second to fourth global compression data GIOSUM26, GIOSUM37 and GIOSUM48, instead of the entire compression data GIOSUMALL.

Referring to FIG. 8, the first output selector 420 includes a control signal generating unit 810, an output signal selecting unit 830, and a latching unit 850.

The control signal generating unit 810 may include first and second control signal generating units 812 and 814 for generating first and second control signals CTR1 and CTR2 in response to the line selection signal CADD<11>, the data width option signal IOx4, and the compression test signal TPARA.

The first control signal generating unit 812 includes a first NAND gate NAND1 configured to receive the line selection signal CADD<11> and the data width option signal IOx4, a first inverter INV1 configured to invert the compression test signal TPARA, and a second NAND gate NAND2 configured to receive an output signal of the first NAND gate NAND1 and an output signal of the first inverter INV1 to output the first control signal CTR1. The second control signal generating unit 814 includes a second inverter INV2 configured to invert the compression test signal TPARA, a third NAND gate NAND3 configured to receive the line selection signal CADD<11>, the data width option signal IOx4, and an output signal of the second inverter INV2, and a third inverter INV3 configured to invert an output signal of the third NAND gate NAND3 to output the second control signal CTR2.

Meanwhile, the output signal generating unit 830 may include first to third signal transferring units 832, 834 and 836 for selectively outputting the entire compression data GIOSUMALL, the signal transferred through the first global input/output line GIO1, or the signal transferred through the fifth global input/output line GIO5 in response to the compression test signal TPARA and the first and second control signals CTR1 and CTR2.

The first signal transferring unit 832 includes a fourth inverter INV4 configured to invert the first control signal CTR1, and a first transfer gate TG1 configured to transfer the signal input through the first global input/output line GIO1 in response to the first control signal CTR1 and an output signal of the fourth inverter INV4. The second transferring unit 834 includes a fifth inverter INV5 configured to invert the second control signal CTR2, and a second transfer gate TG2 configured to transfer the signal input through the fifth global input/output line GIO5 in response to the second control signal INV5 and an output signal of the fifth inverter INV5. The third signal transferring unit 836 includes a sixth inverter INV6 configured to invert the compression test signal TPARA, and a third transfer gate TG3 configured to transfer the entire compression data GIOGUMALL in response to an output signal of the sixth inverter INV6.

Meanwhile, the latching unit 850 latches the signal selected by the output signal selecting unit 830. The latching unit 850 includes a seventh inverter INV7 configured to invert the output signal of the output signal selecting unit 830, and an eighth inverter INV8 configured to invert an output signal of the seventh inverter INV7 to output the inverted signal to an input terminal of the seventh inverter INV7.

The operation of the control signal generating unit 810 will be described below.

When the data width option is x8 in the normal mode, the compression test signal TPARA becomes a logic low level and the data width option signal IOx4 becomes a logic low level. Thus, the first control signal CTR1 is activated and the second control signal CTR2 is deactivated. Consequently, the signal transferred through the first global input/output line GIO1 can be output through the first transfer gate TG1.

When the data width option is x4 in the normal mode, the compression test signal TPARA becomes a logic low level and the data width option signal IOx4 becomes a logic high level, the first and second control signals CTR1 and CTR2 are activated depending on the line selection signal CADD<11>. That is, when the line selection signal CADD<11> is logic low, the first control signal CTR1 is activated and thus the signal transferred through the first global input/output line GIO1 is output through the first transfer gate TG1. When the line selection signal CADD<11> is logic high, the second control signal CTR2 is activated and thus the signal transferred through the fifth global input/output line GIO5 is output through the second transfer gate TG2.

In the compression test mode, the compression test signal TPARA is activated to logic high level and the first and second control signals are deactivated. Therefore, the entire compression data GIOSUMALL is output through the third transfer gate TG3.

Referring again to FIG. 4, the first pipe latch 430 latches the output signal of the first output selector 420 and outputs the latched signal to the outside through the first input/output pad 440.

More specifically, in the compression test mode, the data stored in the first to eighth banks are output to the first input/output pad 440 through the output path including the first to fourth global compressors 470_1, 470_2, 470_3 and 470_4 for compressing data of the first to eighth global input/output lines GIO1, GIO2, GIO3, GIO4, GIO5, GIO6, GIO7 and GIO8 and the entire data compressor 480 for compressing the first to fourth global compression data GIOSUM15, GIOSUM26, GIOSUM37 and GIOSUM48 of the first to fourth global compressors 470_1, 470_2, 470_3 and 470_4 into one entire compression data GIOSUMALL.

The blocks associated with the write operation of the semiconductor memory device in the compression test mode will be described below.

The data input through the first input/output pad 440 is input to the first data aligner 450_1 and a pattern signal generator 490. In the test mode, a plurality of pattern signals are generated using the signal input through an arbitrary pad and stored in the first to eighth banks. Herein, the pattern signal generator 490 can generate a plurality of pattern signals.

The pattern signal generator 490 can generate first to third pattern signals PTN1, PTN2 and PTN3 having a plurality of combinations in response to the input signal IN applied through the first input/output pad 440. Herein, the first to third pattern signals PTN1, PTN2 and PTN3 can be generated using the input signal IN and first to third pattern selection signals TTPH<1:3>. The pattern selection signals TTPH<1:3> may be signals set in a mode register set or may be internal signals. The pattern selection signals TTPH<1:3> may be changed according to design.

The pattern signal generator 490 operates in the compression test mode. In particular, the pattern signal generator 490 performs in response to the entire compression test signal TPARAx1.

The entire compression test signal TPARAx1 is a signal for determining the activation of the pattern signal generator 490. The pattern signal generator 490 performs an existing compression operation according to the entire compression test signal TPARAx1. That is, when the pattern signal generator 490 does not operate in response to the entire compression test signal TPARAx1, it receives data to be stored in the first to eighth banks through the first to fourth input/output pads in the typical manner. On the other hand, when the pattern signal generator 490 operates in response to the entire compression test signal TPARAx1, it generates the first to third pattern signals PTN1, PTN2 and PTN3 having various patterns according to the signal input through the first input/output pad.

Figure 9:
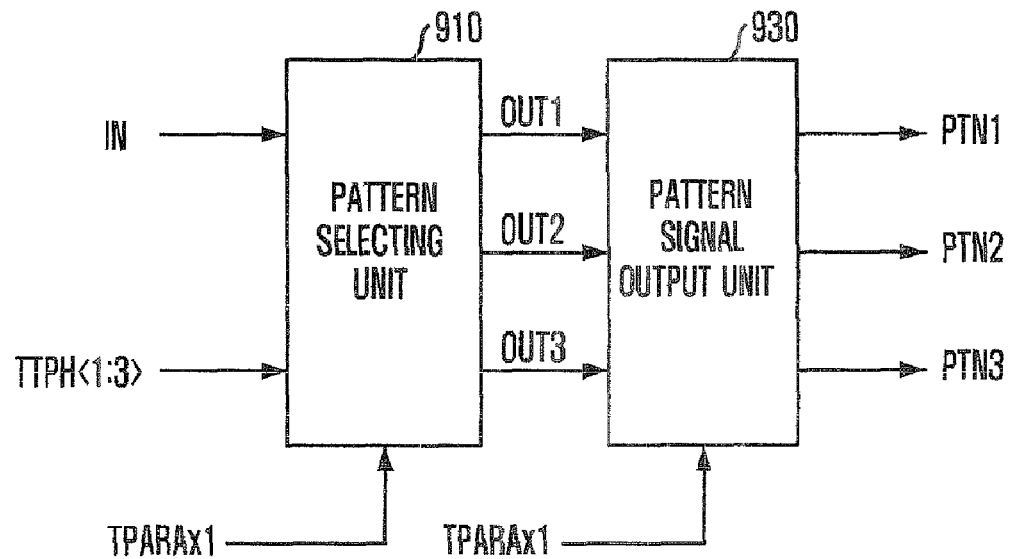
FIG. 9 is a block diagram of a pattern signal generator 490 of FIG. 4.

FIG. 9 is a block diagram of the pattern signal generator 490 of FIG. 4.

Referring to FIG. 9, the pattern signal generator 490 includes a pattern selecting unit 910 and a pattern signal output unit 930.

The pattern selecting unit 910 receives the input signal IN to output the first to third output signals OUT1, OUT2 and OUT3 having various combinations in response to the first to third pattern selection signals TTPH<1:3>.

Figure 10:
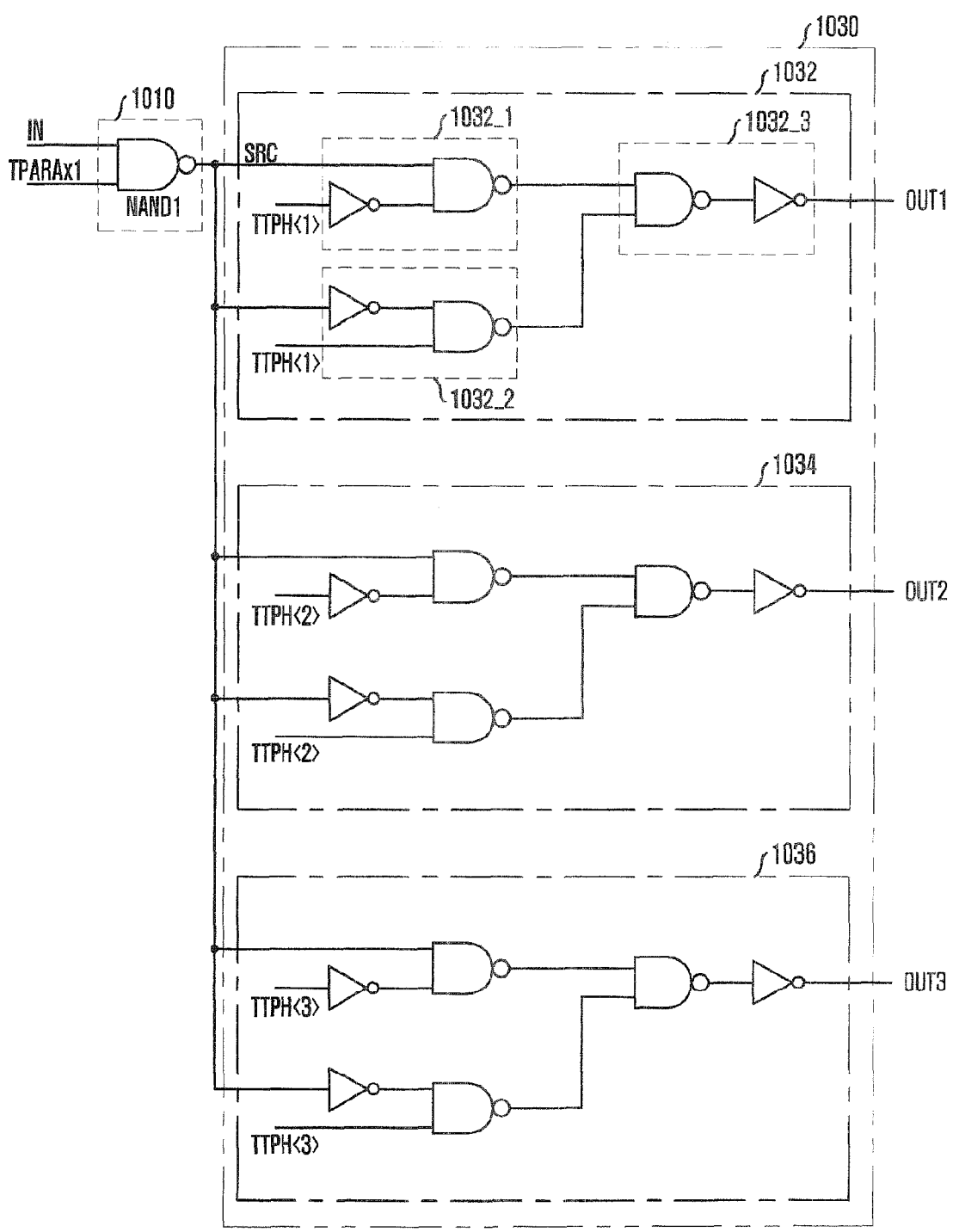
FIG. 10 is a circuit diagram of a pattern selecting unit 910 of FIG. 9.

FIG. 10 is a circuit diagram of the pattern selecting unit 910 of FIG. 9.

Referring to FIG. 10, the pattern selecting unit 910 includes an activating unit 1010 and a pattern setting unit 1030.

The activating unit 1010 outputs the input signal IN as a source signal SRC of the pattern setting unit 1030 in response to the entire compression test signal TPARAx1. The activating unit 1010 may include a first NAND gate NAND1 configured to output the source signal SRC in response to the input signal IN and the entire compression test signal TPARAx1.

The pattern setting unit 1030 generates the first to third output signals OUT1, OUT2 and OUT3 having various patterns in response to the source signal SRC and the first to third pattern selection signals TTPH<1:3>. The pattern setting unit 1030 may include a first pattern setting unit 1032, a second pattern setting unit 1034, and a third pattern setting unit 1036.

The first pattern setting unit 1032 receives the source signal SRC to output the first output signal OUT1 corresponding to the first pattern selection signal TTPH<1>, and the second pattern setting unit 1034 receives the source signal SRC to output the second output signal OUT2 corresponding to the second pattern selection signal TTPH<2>. The third pattern setting unit 1036 receives the source signal SRC to output the third output signal OUT3 corresponding to the third pattern selection signal TTPH<3>.

Since the first to third pattern setting units 1032, 1034 and 1036 have the similar structure, the first pattern setting unit 1032 will be described as a representative example for convenience.

The first pattern setting unit 1032 includes a first signal changing unit 1032_1 configured to invert the source signal SRC in response to the first pattern selection signal TTPH<1>, a second signal changing unit 1032_2 configured to output the source signal SCR without change in response to the first pattern selection signal TTPH<1>, and a signal output unit 1032_3 configured to generate the first output signal OUT1 in response to output signals of the first and second signal changing units 1032_1 and 1032_2.

More specifically, the first signal changing unit 1032_1 inverts the source signal SRC when the first pattern selection signal TTPH<1> is logic low, and the second signal changing unit 1032_2 outputs the source signal SRC without change when the first pattern selection signal TTPH<1> is logic high. In view of the input signal IN, the input signal IN is output as the first output signal OUT1 when the first pattern selection signal TTPH<1> is logic low, and the inverted input signal is output as the first output signal OUT1 when the first pattern selection signal TTPH<1> is logic low.

The first to third output signals OUT1, OUT2 and OUT3 generated through the above-described operations may have a variety of combinations. The pattern selecting unit 910 can output the input signal IN or the first to third output signals OUT1, OUT2, OUT3 corresponding to the inverted input signal in response to the first to third pattern selection signals TTPH<1:3>. That is, the pattern selecting unit 910 generates the first to third output signals OUT1, OUT2 and OUT3 whose patterns are selected in response to the input signal IN and the first to third pattern selection signals TTPH<1:3>. The first to third output signals OUT1, OUT2 and OUT3 will be the first to third pattern signals PTN1, PTN2 and PTN3, which will be described later. In other words, the patterns of the first to third pattern signals PTN1, PTN2 and PTN3 will be selected by the input signal IN and the first to third pattern selection signals TTPH<1:3>.

Referring again to FIG. 9, the pattern signal output unit 930 outputs the first to third output signals OUT1, OUT2 and OUT3 of the pattern selecting unit 910 as the first to third pattern signals PTN1, PTN2 and PTN3 in response to the entire compression test signal TPARAx1.

Figure 1:
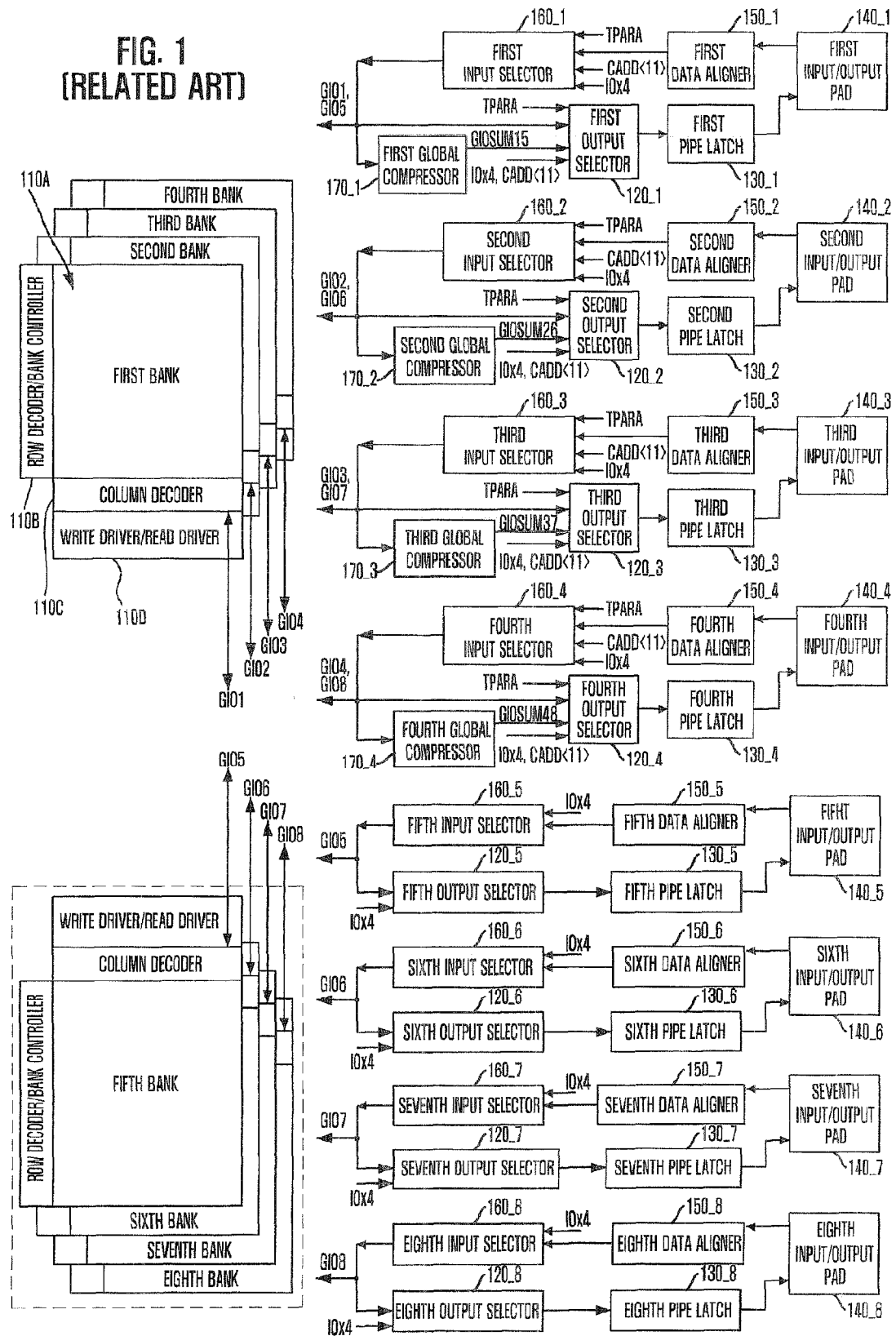
FIG. 1 is a block diagram of a conventional semiconductor memory device.
Figure 2:
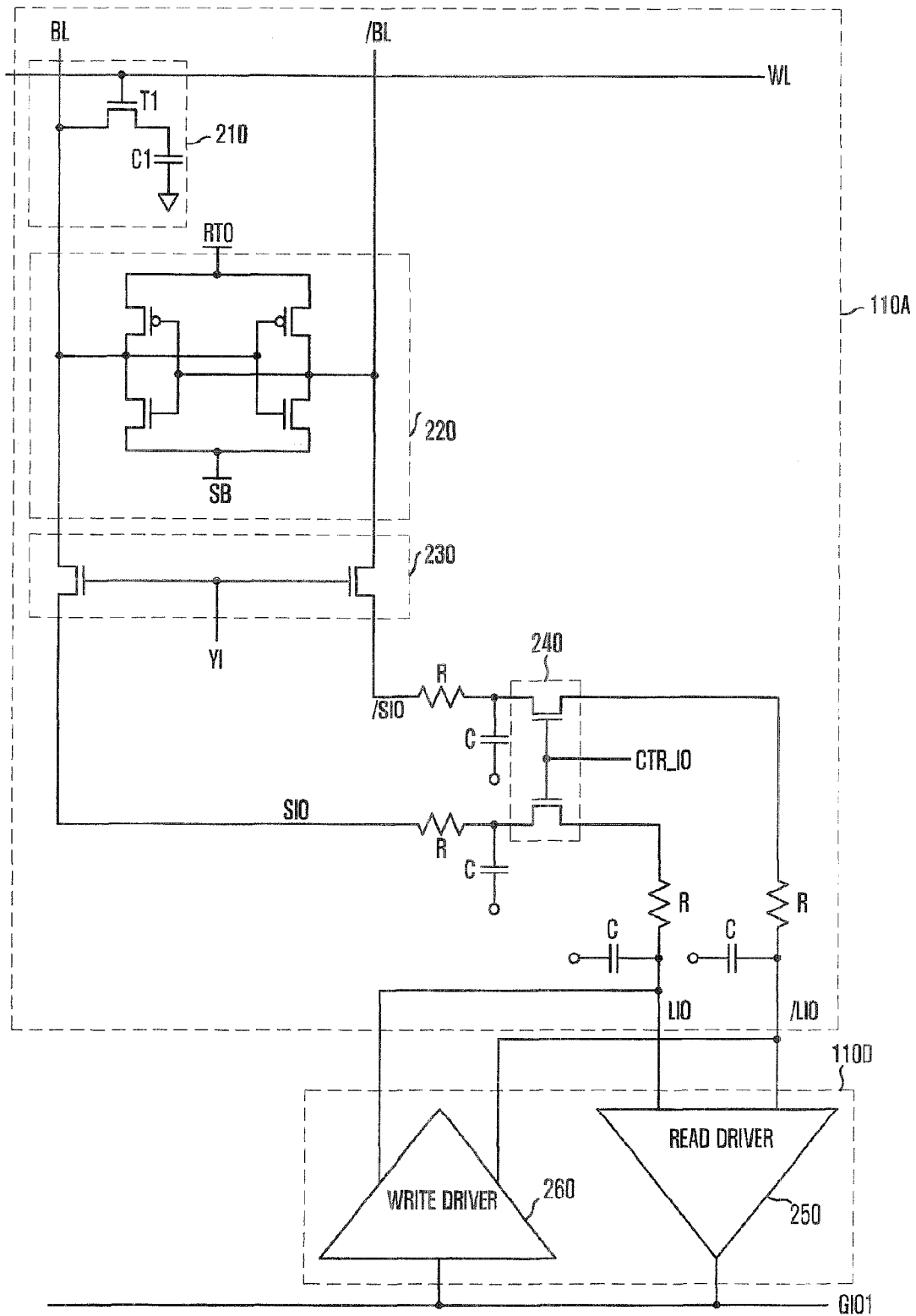
FIG. 2 is a circuit diagram illustrating a read operation and a write operation of a semiconductor memory device.
Figure 3:
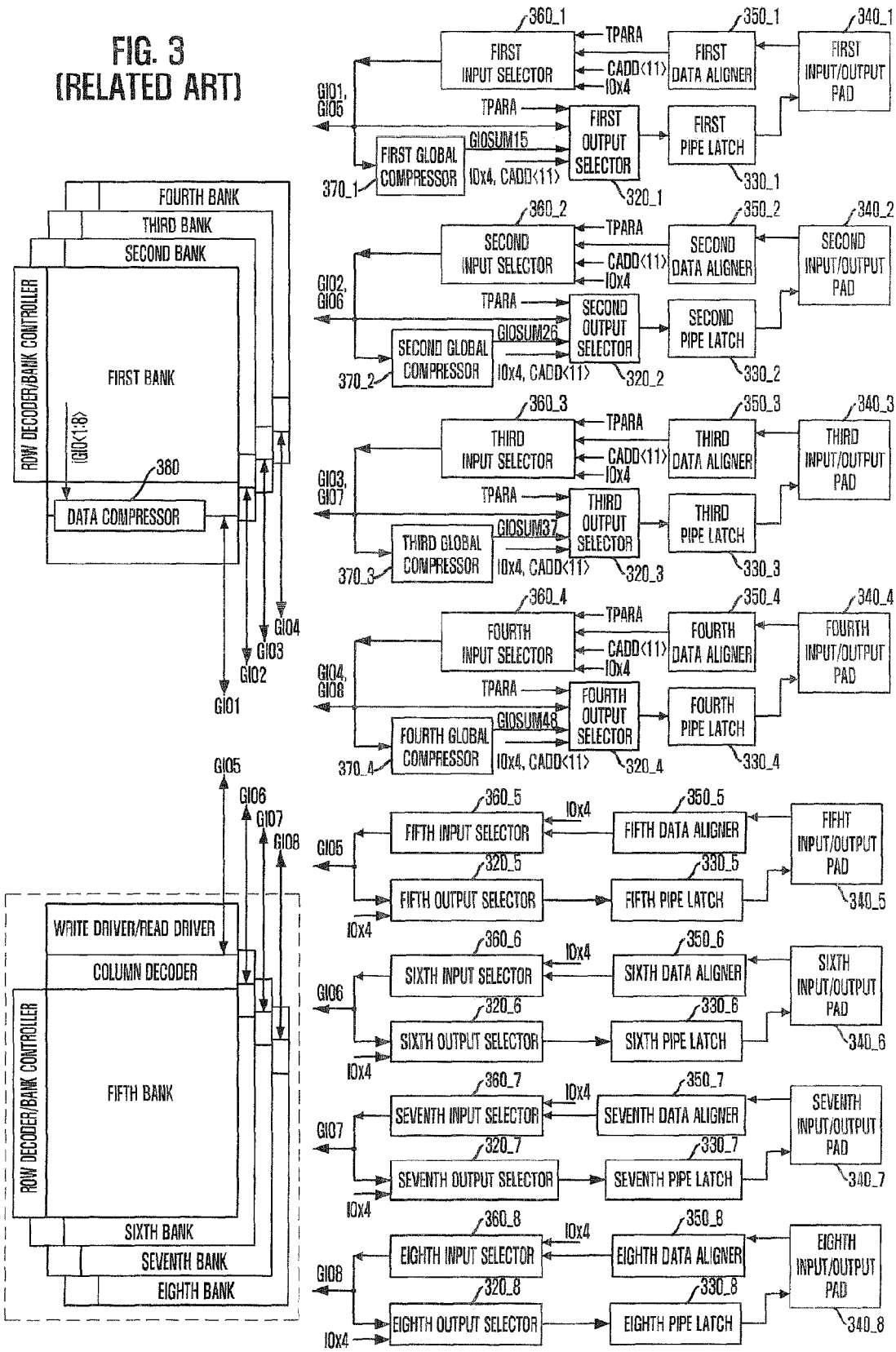
FIG. 3 is a block diagram for explaining the blocks associated with a compression operation of the semiconductor memory device.
Figure 11:
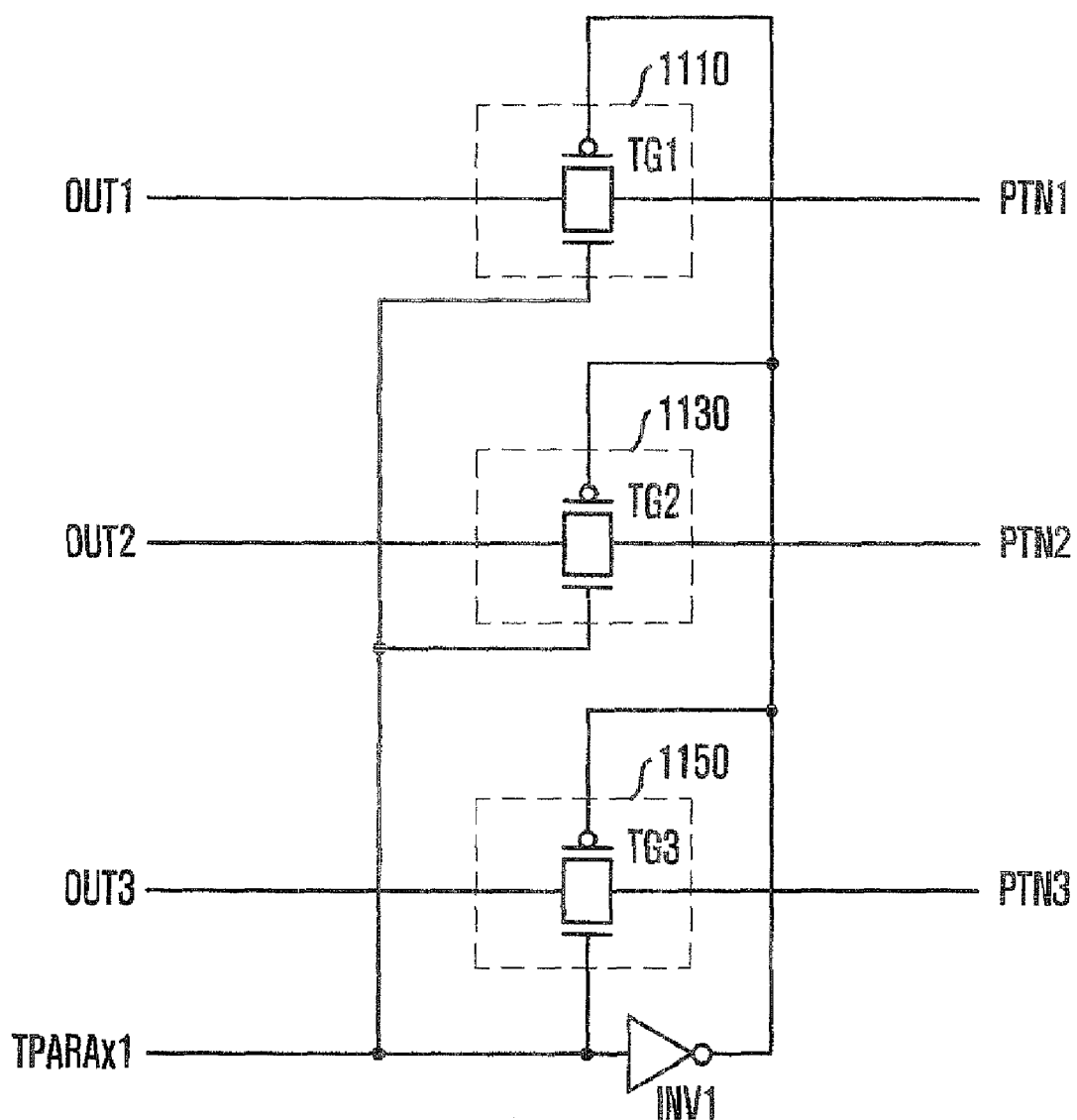
FIG. 11 is a circuit diagram of a pattern signal output unit 930 of FIG. 3.

FIG. 11 is a circuit diagram of the pattern signal output unit 930 of FIG. 3.

Referring to FIG. 11, the pattern signal output unit 930 includes a first transferring unit 1110, a second transferring unit 1130, and a third transferring unit 1150. The first transferring unit 1110 transfers the first output signal OUT1 as the first pattern signal PTN1 in response to the entire compression test signal TPARAx1, and the second transferring unit 1130 transfers the second output unit OUT2 as the second pattern signal PTN2 in response to the entire compression test signal TPARAx1. The third transferring unit 1150 transfers the third output signal OUT3 as the third pattern signal PTN3 in response to the entire compression test signal TPARAx1. The first to third transferring units 1110, 1130 and 1150 may include first to third transfer gates TG1, TG2 and TG3 that are turned on in response to the entire compression test signal TPARAx1 and an output signal of an inverter INV1 for inverting the entire compression test signal TPARAx1.

Referring again to FIG. 4, the input signal IN applied through the first input/output pad 440 may be input to the first data aligner 450_1, and the first to third pattern signals PTN1, PTN2 and PTN3 output from the pattern signal generator 490 may be input to the second to fourth data aligners 450_2, 450_3 and 450_4. The first to fourth data aligners 450_1, 450_2, 450_3 and 450_4 align the respective input signals to output the aligned data to the first to fourth input selectors 460_1, 460_2, 460_3 and 460_4.

The first to fourth input selectors 460_1, 460_2, 460_3 and 460_4 output data to the global input/output lines in response to the compression test signal TPARA. Specifically, the first input selector 460_1 outputs the data to the first and fifth global input/output lines GIO1 and GIO5, and the second input selector 460_2 outputs the data to the second and sixth global input/output lines GIO2 and GIO6. The third input selector 460_3 outputs the data to the third and seventh global input/output lines GIO3 and GIO7, and the fourth input selector 460_4 outputs the data to the fourth and eighth global input/output lines GIO4 and GIO8. Then, the data applied to the first to eighth global input/output lines GIO1, GIO2, GIO3, GIO4, GIO5, GIO6, GIO7 and GIO8 are stored in the first to eighth banks, respectively.

Since the first to fourth input selectors 460_1, 460_2, 460_3 and 460_4 have the similar structure, the first input selector 460_1 will be described as a representative example.

Figure 12:
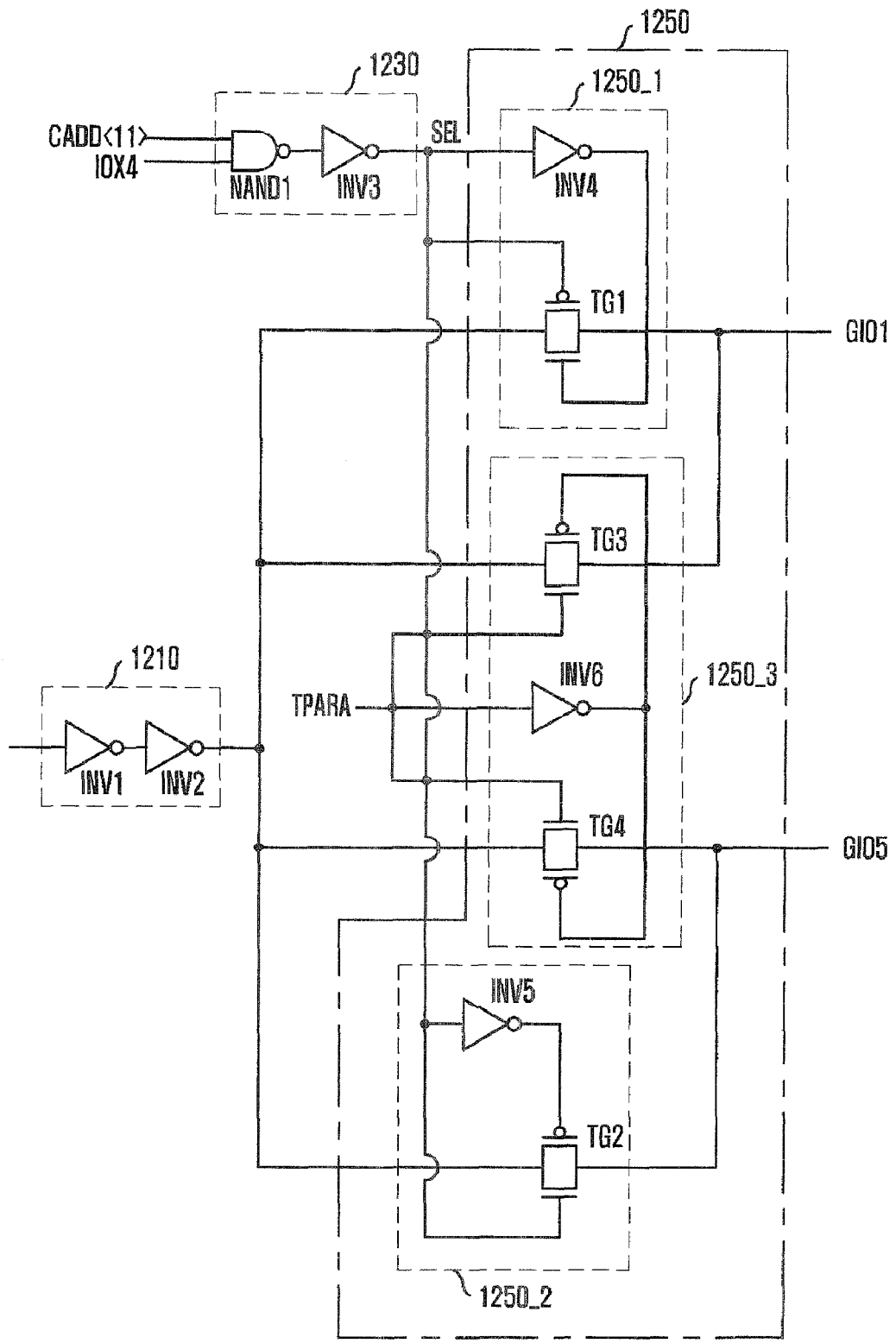
FIG. 12 is a circuit diagram of a first input selector 460_1 of FIG. 4.

FIG. 12 is a circuit diagram of the first input selector 460_1 of FIG. 4.

Referring to FIG. 12, the first input selector 460_1 includes a buffering unit 1210, a selection signal generating unit 1230, and a selection output unit 1250.

The buffering unit 1210 buffers the output signal of the first data aligner (450_1 in FIG. 4) and may includes first and second inverters INV1 and INV2.

The selection signal generating unit 1230 generates a selection signal SEL in response to the line selection signal CADD<11> and the data width option signal IOx4. The selection signal generating unit 1230 may include a first NAND gate NAND1 configured to receive the line selection signal CADD<11> and the data width option signal IOx4, and a third inverter INV3 configured to invert an output signal of the first NAND gate NAND1 to output the selection signal SEL.

The selection output unit 1250 transfers the output signal of the buffering unit 1210 t the global input/output lines GIO1 and GIO5 in response to the selection signal SEL and the compression test signal TPARA. The selection output unit 1250 may include a first selection output unit 1250_1, a second selection output unit 1250_2, and a third selection output unit 1250_3.

The first selection output unit 1250_1 includes a fourth inverter INV4 configured to invert the selection signal SEL, and a first transfer gate TG1 configured to the output signal of the buffering unit 1210 to the first global input/output line GIO1 in response to an output signal of the fourth inverter INV4. The second selection output unit 1250_2 includes a fifth inverter INV5 configured to invert the selection signal SEL, and a second transfer gate TG2 configured to transfer the output signal of the buffering unit 1210 to the fifth global input/output line GIO5 in response to the selection signal SEL and an output signal of the fifth inverter INV5. The third selection output unit 1250_3 includes a sixth inverter INV6 configured to invert the compression test signal TPARA, and third and fourth transfer gates TG3 and TG4 configured to transfer the output signal of the buffering unit 1210 to the first and fifth global input/output lines GIO1 and GIO5 in response to the compression test signal TPARA and an output signal of the sixth inverter INV6.

More specifically, the first input selector 460_1 transfers the output signal of the buffering unit 1210 to the first global input/output line GIO1 or the fifth global input/output line GIO5 in response to the line selection signal CADD<11> in the normal mode, and transfers the output signal of the buffering unit 1210 to the first and fifth global input/output lines GIO1 and GIO5 in response to the compression test signal TPARA in the compression test mode.

Referring again to FIG. 4, the first to third pattern signals PTN1, PTN2 and PTN3 generated from the pattern signal generator 490 are transferred to the first to eighth banks through the input path including the second to fourth data aligners 450_2, 450_3 and 450_4 and the second to fourth input selectors 4602, 460_3 and 460_4.

As described above, in the compression test mode, the conventional semiconductor memory device stores the data in the banks using four input/output pads, and outputs the compressed data using four input/output pads. Therefore, when storing the data in the banks using four input/output pads, the test operator must apply the data to be tested to the respective input/output pads. Furthermore, since a test apparatus having finite test pins must allocate four test pins per the semiconductor memory device, there is a limitation in the number of semiconductor memory devices that can be tested at a time.

However, the semiconductor memory device in accordance with the embodiment of the invention can store the data of various patterns in the banks using one input/output pad in the compression test mode and can output the compressed data using one input/output pad. Therefore, in testing the semiconductor memory device, the test efficiency can be maximized. Furthermore, since the data of various patterns are stored and compressed, the test result with high reliability can be obtained.

Moreover, the number of the semiconductor memory devices that can be tested at a time is maximized in the test apparatus having finite test pins. That is, in the case of the test apparatus having 128 test pins, 32 semiconductor memory devices are tested according to the related art because four test pins must be allocated per one semiconductor memory device. However, in accordance with the embodiment of the invention, 128 semiconductor memory devices can be tested at a time because one test pin is allocated per one semiconductor memory device. That is, the number of the semiconductor memory devices that can be tested at a time is increased four times. This means that the test time is reduced and thus the fabrication cost of the semiconductor memory device is reduced.

As described above, since the compression test operation is performed using the data applied through one input/output pad, the test time and cost can be reduced.

Furthermore, since data of various patterns can be stored in the banks even though one input/output pad is used, the work efficiency of the test operator can be maximized.

Moreover, since the data of various patterns are stored and compressed into one compression data, the compression test result with high reliability can be obtained.

While the invention has been described with respect to the specific embodiments, it will be apparent to those skilled in the art that various changes and modifications may be made without departing from the spirit and scope of the invention as defined in the following claims.

Although the semiconductor memory device having eight data input/output pads has been exemplarily described in the above embodiments, the invention can also be applied to semiconductor memory devices having a plurality of data input/output pads. In addition, the locations and types of the logic gates and transistors may be differently implemented according to polarities of the input signals.

Furthermore, although it has been described in the above embodiments that the data are input through the first input/output pad 440 and stored in the banks and the entire compression data GIOSUMALL is output through the first input/output pad 440, the invention can also be applied to the case where the data are input through an arbitrary pad, instead of the first input/output pad 440, and the entire compression data GIOSUMALL is output through an arbitrary pad, instead of the first input/output pad 440.

What is claimed is:

1. A semiconductor memory device, comprising:
   a plurality of banks, each including a plurality of memory cells;
   a pattern signal generator configured to generate a plurality of pattern signals having a plurality of combinations in response to an input signal applied through an arbitrary pad in a compression test mode;
   a plurality of input paths through which the plurality of pattern signals are transferred to the corresponding banks; and
   an output path configured to compress the data stored in the banks and output the compressed data through an arbitrary pad in the compression test mode,
   wherein the output path includes a plurality of global compressors configured to compress data applied to a plurality of global input/output lines corresponding to the plurality of banks and an entire data compressor configured to compress output signals of the global input/output lines into one data.

2. The semiconductor memory device of claim 1, further comprising an output selector configured to selectively output an output signal of the entire data compressor or an output signal of a global compressor of the global compressors in the compression test mode and a pipe latch configured to latch an output signal of the output selector.

3. The semiconductor memory device of claim 1, wherein the pattern signal generator includes a pattern selecting unit configured to select the plurality of pattern signals in response to the input signal and a pattern selection signal, and a pattern signal output unit configured to output an output signal of the pattern selecting unit as the plurality of pattern signals.

4. The semiconductor memory device of claim 3, wherein the pattern selecting unit includes an activating unit enabled in the compression test mode to output the input signal as a source signal, and a pattern setting unit configured to generate an output signal having various patterns in response to the source signal and the pattern selection signal.

5. The semiconductor memory device of claim 4, wherein the pattern setting unit outputs the source signal or an inverted source signal in response to the pattern selection signal.

6. The semiconductor memory device of claim 3, wherein the pattern selection signal is set in a mode register set or generated from the inside of the semiconductor memory device.

7. The semiconductor memory device of claim 1, wherein each of the input paths includes a data aligner configured to align a pattern signal, and an input selector configured to output an output signal of the data aligner through a corresponding data input/output line in response to a selection signal and a compression test signal corresponding to the compression test mode.

8. The semiconductor memory device of claim 7, wherein the selection signal includes a data width option signal corresponding to a data width option, and a line selection signal for selecting a global input/output line.

9. A method for operating a semiconductor memory device, the method comprising:
   inputting/outputting data through a plurality of pads in a normal mode;
   generating a plurality of pattern signals having a plurality of combinations in response to an input signal applied through one arbitrary pad of the plurality of pads in a compression test mode;
   storing data corresponding to the pattern signals in a plurality of memory cell banks; and
   compressing the data stored in the banks to output the compressed data through an arbitrary pad of the plurality of pads,
   wherein the outputting of the data through the arbitrary pad includes compressing the data stored in the banks to output the compressed data as a plurality of global compression data and compressing the plurality of global compression data into one entire compression data in the compression test mode.

10. The method of claim 9, further comprising selectively outputting the entire compression data or a global compression data of the plurality of global compression data in response to a selection signal and a compression test signal corresponding to the compression test mode and latching the selected signal.

11. The method of claim 10, wherein the selection signal includes a data width option signal corresponding to a data width option, and a line selection signal for selecting a global input/output line.

* * * * *